(12) United States Patent  
Köllmann

(10) Patent No.: US 8,400,193 B2  
(45) Date of Patent: Mar. 19, 2013

(54) BACKDRIVE PROTECTION CIRCUIT

(75) Inventor: Andreas Johannes Köllmann, Rosengarten (DE)

(73) Assignee: NXP B.V., Eindhoven (NL)

( * ) Notice: Subject to any disclaimer, the term of this patent is extended or adjusted under 35 U.S.C. 154(b) by 169 days.

(21) Appl. No.: 13/052,271

(22) Filed: Mar. 21, 2011

(65) Prior Publication Data

US 2012/0242372 A1    Sep. 27, 2012

(51) Int. Cl.
*H03K 3/00* (2006.01)

(52) U.S. Cl. .................. 327/108; 327/318; 327/321

(58) Field of Classification Search .................. 327/108, 327/318, 321
See application file for complete search history.

(56) References Cited

U.S. PATENT DOCUMENTS

| 5,555,149 | A | 9/1996 | Wert et al. |
| 6,081,412 | A | 6/2000 | Duncan et al. |
| 7,123,053 | B1 | 10/2006 | Wert |
| 7,642,600 | B1 | 1/2010 | Wert |
| 8,174,296 | B2 * | 5/2012 | Kurokawa ............ 327/108 |

FOREIGN PATENT DOCUMENTS

WO    01/76070 A1    10/2001

* cited by examiner

*Primary Examiner* — Kenneth B. Wells

(57) ABSTRACT

Methods, devices and circuits are provided for protection from backdrive current. One such device is subject to back voltage from an output node of the device and includes circuitry that is configured to compare the supply voltage node and the output node. In response to the comparison, the circuitry generates an output signal. Level shifted versions of the output signal are used to provide an output voltage corresponding to the higher of a supply voltage node and an output node. Switches are used to place the device in different modes in response to the output signal.

20 Claims, 5 Drawing Sheets

BACKDRIVE PROTECTION CIRCUIT

Aspects of the present disclosure are directed toward a backdrive protection circuit. In certain embodiments, the backdrive protection circuit is responsive to a comparison of a voltage on a supply voltage node and a voltage on an output node.

Some Integrated Circuits (ICs) are designed for a multiplicity of potential uses. The ICs can be used with a variety of different applications and within different devices. Input/output (I/O) ports provide an interface between the ICs and other components within the device or system. Power is provided to the ICs through one or more supply ports; however, it cannot always be guaranteed that external devices will be powered by the same supply voltage. This may result in voltages being present on the I/O ports without power being present on the supply ports. In some instances, this may result in uncontrolled large currents floating back into a circuit, which could damage the circuit. Such currents can also result in unwanted power drain on batteries or otherwise adversely affect the device or system.

When a circuit is not powered up, current floating from the output node to the supply node could cause a floating/unpowered supply to begin to charge itself up. This charging of the supply node could result in unwanted power-up scenarios and also may draw power, which can drain battery life-time of mobile devices. In severe cases, uncontrolled power-up sequences might cause the circuit to fail (e.g., hang due to problems with power-up sequencing).

In some instances, an I/O port might be driven by different external output stages. This might include situations where the supply levels of the output stages have different voltage levels. It is possible that the supply levels of the output stages can be higher than the supply of the IC, which can cause problems in certain situations.

Embodiments of the present disclosure relate to a backdrive protection circuit that can be configured for use with PMOS output stages.

Consistent with one embodiment of the present disclosure, a transistor output stage device is subject to back voltage from an output node of the device. The device includes a transistor having a gate, a source, a drain and a body. There is an electrical connection between a supply voltage node and the source and an electrical connection between the output node of the device and the drain. A comparison circuit is configured and arranged to generate a selection signal in response to a comparison of a voltage on the supply voltage node and a voltage on the output node. A voltage selection circuit is configured and arranged to provide, in response to the selection signal, a selected voltage that is the higher of: 1) the voltage on the supply voltage node and 2) the voltage on the output node. There is an electrical connection between the body and a node providing the selected voltage. A gate controller is configured and arranged to: 1) connect, in response to the selection signal indicating that the voltage on the supply voltage node is higher than the voltage on the output node, the gate to an input of the device, and 2) connect, in response to the selection signal indicating that the supply voltage is lower than the voltage on the output node, the gate to the node providing the selected voltage.

In certain embodiments of the present disclosure, only one of the input node or selected voltage is ever connected to the gate of the transistor at the same time. In various embodiments, it is possible that neither could be connected at a given time.

According to an embodiment of the present disclosure, a method is provided for using a transistor output stage device including a transistor having a gate, a source, a drain and a body. The device is subject to back voltage from an output node of the device. The method includes comparing a voltage on the supply voltage node to a voltage on the output node. In response to comparing, a first comparison output signal is generated. A selected voltage is provided that is the higher of: 1) the voltage on the supply voltage node and 2) the voltage on the output node. A second comparison output signal is generated by level shifting the first comparison output signal to a voltage level corresponding to the selected voltage. The body of the transistor is electrically connected to the selected voltage. In response to the second comparison output signal, the selected voltage is connected to the gate of the transistor using a switch. In response to the second comparison output signal, an input node is connected to the gate of the transistor using a switch.

In certain embodiments of the present disclosure, only one of the input node or selected voltage is ever connected to the gate of the transistor at the same time. In various embodiments, it is possible that neither could be connected.

According to other embodiments of the present disclosure, a device includes a transistor output stage device including a transistor having a gate, a source, a drain and a body. The device is subject to back voltage from an output node of the device and includes circuitry that is configured to compare a voltage on the supply voltage node to a voltage on the output node; provide a selected voltage that is the higher of the voltage on the supply voltage node and the voltage on the output node. The circuitry is configured to generate, in response to comparing, a first comparison output signal. Another aspect of the circuitry relates to generating a second comparison output signal by level shifting the first comparison output signal to a voltage level corresponding to the selected voltage. The circuitry is further configured to provide the selected voltage to the body of the transistor. The circuitry is also configured to enable a first switch to connect, in response to the second comparison output signal, the selected voltage to the gate of the transistor and to enable a second switch to connect, in response to the second comparison output signal, an input node to the gate of the transistor.

The above discussion is not intended to describe each embodiment or every implementation. The figures and following description also explicitly describe various embodiments and other embodiments, modifications, equivalents, and alternatives fall within the spirit and scope of the disclosure.

Various example embodiments may be more completely understood in consideration of the following detailed description in connection with the accompanying drawings, in which.

Figure 1:
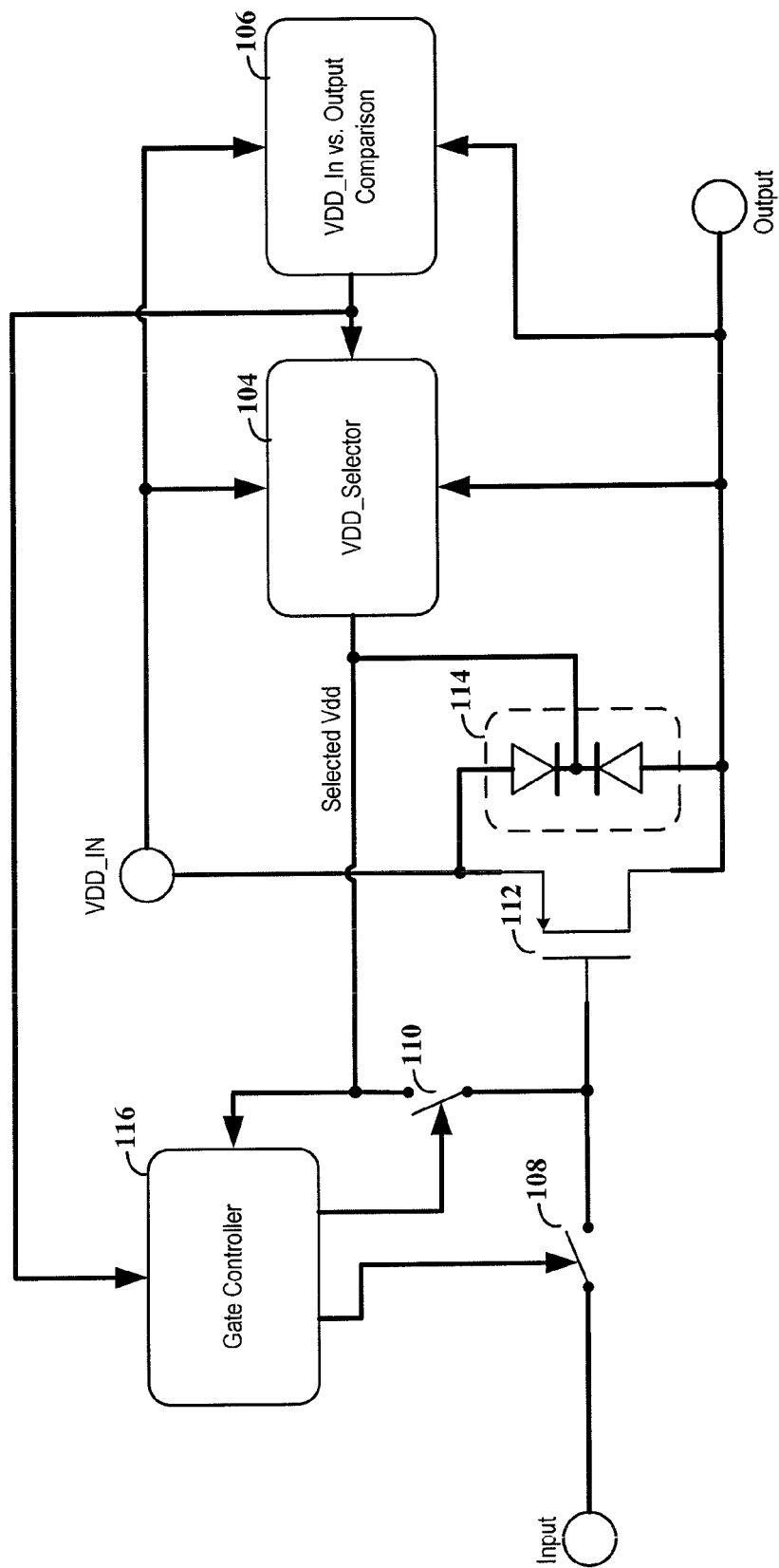
FIG. 1 depicts a block diagram of an output stage device, consistent with embodiments of the present disclosure.

While the disclosure is amenable to various modifications and alternative forms, examples thereof have been shown by way of example in the drawings and will be described in detail. It should be understood, however, that the intention is not to limit the disclosure to the particular embodiments shown and/or described. On the contrary, the intention is to cover all modifications, equivalents, and alternatives falling within the spirit and scope of the disclosure.

The various disclosed embodiments are believed to be applicable to a variety of different types of processes, devices, and arrangements for use with various different systems and devices. While the embodiments are not necessarily so limited, various aspects of the disclosure may be appreciated through a discussion of examples using this context.

Consistent with an embodiment of the present disclosure, a transistor output stage device is subject to back voltage from an output node of the transistor output stage device. The device is configured to operate in different modes of operation, the different modes being initiated in response to a comparison of a voltage on an internal supply voltage node to a voltage on an output node of the output stage. The supply voltage node is referred to as internal relative to the output node, which can be driven by another device and therefore has the potential to be higher than the internal supply node. For instance, the internal supply node might provide power to various components of an integrated circuit that has one or more of the transistor output stage devices. Together, the different modes protect the device from backdrive current while providing desired output stage functions in the absence of problematic voltages on the output node. For instance, a first mode powers components of the device using an internal supply voltage when the internal supply voltage is higher than the voltage on the output node. A second mode powers components of the device using the voltage on the output node. Thus, the device may be subject to a back voltage in which a voltage on its output node that is greater than the voltage on the internal supply voltage node, however, the device is protected from backdrive current despite the presence of a back voltage.

According to certain embodiments of the present disclosure, the device is part of an integrated circuit having circuitry that is powered by an internal supply node. The first mode of operation powers the components of the transistor output stage device using the internal supply node. The second mode powers the components using power provided from the output port, while effectively decoupling the components from the internal supply node of a circuit. This can be particularly useful for protecting the circuit from a back voltage that could create a current from the output stage and adversely affect the voltage on the internal supply node (e.g., by raising the voltage through backdrive current).

Aspects of the present disclosure are directed toward the use of level shifters to generate control signals having voltage levels consistent with either the voltage on an internal supply node or the voltage on the output port. These generated control signals can then be used to control circuitry powered by either the voltage on the internal supply node or the voltage on the output port, respectively. For instance, a voltage selection circuit can respond to control signals by providing power using either the voltage on the internal supply node or the voltage on the output port. This voltage selection circuit can include a first switch circuit that is connected to and/or powered by the voltage on the internal supply node. When this first switch circuit is enabled/active, power is provided from the voltage on the internal supply node. This first switch is therefore controlled by the control signal. A second switch circuit is connected to and/or powered by the voltage on the output port. When this second switch circuit is enabled/active, power is provided from the voltage on the output port. This second switch is also controlled by the control signal.

Consistent with embodiments of the present disclosure, the first and second switch circuits can be controlled by first and/or second version(s) of the control signal that have been level shifted in accordance with one or both of the voltage on the output port or the voltage on the internal supply node, respectively.

Consistent with certain embodiments of the present disclosure, the first switch circuit can include two switch elements (e.g., transistors). The first switch element can be controlled by a first version of the control signal while the second switch element can be controlled by a second version of the control signal. Similarly, the second switch circuit can include two switch elements, each controlled by a respective version of the control signal. This can be particularly useful for avoiding the situation where both switch circuits are active, which could cause a short between the supply node and the output node.

Aspects and embodiments of the present disclosure can be particularly useful for limiting backdrive current from floating into the output port across a PMOS transistor (or its parasitic diodes) towards the supply of the output stage. Moreover, certain embodiments are directed toward providing such functionality without the use of a backdrive-blocking series element.

Backdrive current/conduction can include, but is not necessarily limited to, current that passes through the parasitic diodes and reverse active mode of a PMOS transistor. In a P-type substrate process technology, a PMOS transistor can include two parasitic diodes arranged with their cathodes connected to the N-well of the transistor (in an anti-series configuration). The first diode is located between the source and the N-well of the transistor. The second diode is located between the drain and the N-well. It can be desirable to connect the N-well to the internal supply node, which can prevent the diodes from opening in normal operation. If, however, the output voltage VOUT rises above the internal supply node, the second diode may become forward biased and conduct current (e.g., at around 0.6V). This current can quickly increase as the voltage difference increases.

If the N-well is kept floating; the anti-series connection prevents current from floating through the parasitic diodes. A flowing N-well, however, can be at risk to a latch-up condition, e.g., due to the N-well voltage dropping below the substrate voltage. Moreover, a floating N-well can result in the PMOS-transistor not completely being shut off, e.g., due to a backgate-effect of the N-well. Depending on the process technology and dimensions of the PMOS-transistor, significant current might be seen due to such a backgate effect.

In certain embodiments, the use of one or more large output transistors is desirable, e.g., for low-dropout (LDO) regulators or IO-drivers designed to deliver high currents. In such embodiments, the potential for backdrive current can be amplified. For instance, if the gate of transistor is pulled up to the supply-voltage in order to shut-off the transistor, then when the voltage on the output port exceeds the supply voltage, the drain and source of the transistor are effectively exchanged. The output transistor would then source current onto the supply voltage node. The amount of current can be at the subthreshold level or, for when the output voltage exceeds the supply voltage by more than the threshold level, large amounts of current could potentially be sourced.

Aspects of the present disclosure recognize that a series-connected backdrive blocking element (e.g., a diode or transistor) can introduce an additional voltage drop and/or reduce the drive-strength of the I/O port. This can lead to a reduced voltage swing because the upper voltage limit of the I/O port is reduced by the voltage drop. This can also require increased substrate area consumption due to larger devices needed to compensate for the additional drop caused by the series blocking element.

Other aspects of the present disclosure recognize that NMOS-transistors in source-follower configuration can prevent backdrive current, but that charge pump circuits, used to enable use of NMOS-transistors for high-side drive I/Os or low-drop-out voltage regulators, can complicate circuit design including, but not limited to, issues of reliability and limits of the process technology, which may not allow for sufficiently high voltages. Other complexities include the design and need for an oscillator in the charge pump.

Accordingly, various embodiments of the present disclosure provide protection from backdrive current without a series-connected backdrive blocking element and/or without a charge pump.

Consistent with embodiments of the present disclosure, the body of an output transistor of an output stage device is connected to a node that is driven to the greater of the voltage on the internal supply node and the voltage on the output port. According to various embodiments, the gate of the output transistor is connected to either a control signal or the greater of the voltage on the internal supply node and the voltage on the output port. For instance, when the output stage device is in normal operation, a control signal determines the behavior of the output port. When, however, there is a potential backdrive situation, the voltage on the output port is used. This can be particularly useful for preventing current from the output transistor allowing current from the output port to reach the supply node.

According to some embodiments of the present disclosure, an output stage device includes a transistor having a gate, a source, a drain and a body. An electrical connection exists between a supply voltage node and the source. An electrical connection exists between the output node of the device and the drain. A comparator circuit is configured and arranged to generate a selection signal in response to a comparison of a voltage on the supply voltage node and a voltage on the output node. A voltage selection circuit is configured and arranged to provide, in response to the selection signal, a selected voltage that is the higher of the voltage on the supply voltage node and the voltage on the output node. An electrical connection exists between the body and a node providing the selected voltage. A gate controller is configured and arranged to connect, in response to the selection signal indicating that the voltage on the supply voltage node is higher than the voltage on the output node, the gate to an input of the device, and to connect, in response to the selection signal indicating that the supply voltage is lower than the voltage on the output node, the gate to the node providing the selected voltage.

Turning now to the figures, FIG. 1 depicts a block diagram of an output stage device, consistent with embodiments of the present disclosure. During normal operation, an input to the output stage device generates an output using transistor 112. Transistor 112 includes parasitic diodes 114, with the common connection point between the diodes representing the body (e.g., the N-well) of the transistor. VDD_IN represents a supply voltage that is used to generate the output signal in combination with the transistor 112. This VDD_IN can, in some embodiments, represent a voltage supply node that powers portions of an IC that includes various control logic/circuits in addition to the output stage device and/or can represent a voltage supply node that powers portions of other circuitry/ICs.

Comparator circuit 106 generates a selection signal in response to a comparison of a voltage on the supply voltage node and a voltage on the output node. The selection signal/output of comparator circuit 106 therefore provides an indication as to which of these voltages is higher than the other. Certain embodiments realize that some amount of offset is possible (or even desirable with comparator circuit 106). For instance, the comparator circuit 106 can be configured to detect when the voltage on the output node is a certain amount higher than the voltage on VDD_IN. Thus, the selection signal represents a comparison that is offset, rather than a direct comparison of the voltages.

A voltage selection circuit 104 is configured and arranged to, in response to the selection signal, provide a selected voltage that is the—by the amount of any potential offset—higher of the voltage on the supply voltage node and the voltage on the output node. Thus, the output of the voltage selection circuit 104 is the selected voltage. This selected VDD is then used to bias the body of the transistor 112. The selected VDD is also provided to gate controller 116.

Gate controller 116 is configured to connect, in response to the selection signal indicating that the voltage on the supply voltage node is higher than the voltage on the output node, the gate to an input of the device. Gate controller 116 is also configured to connect, in response to the selection signal indicating that the supply voltage is lower than the voltage on the output node, the gate to the node providing the selected voltage. This connection process can be accomplished using switches 108 and 110. Thus, in a first mode, the input to the output stage device is connected to the gate of transistor 112. In a second mode, the gate of transistor 112 is connected to the selected voltage.

Consistent with an embodiment of the present disclosure, the first mode represents the situation where VDD_IN exceeds the voltage on the output node and the second mode represents a potential backdrive situation, e.g., where the voltage on the output node exceeds the VDD_IN voltage.

Embodiments of the present disclosure can be particularly useful with regards to reducing (or eliminating) a voltage drop seen on the output of the device, reducing silicon area and/or to providing high drive-current. For instance, various embodiments do not use an additional series blocking element between the drain of transistor 112 and the output node. This can be particularly useful for applications relating to IO-drivers or to low-dropout (LDOs) regulators.

Figure 2:
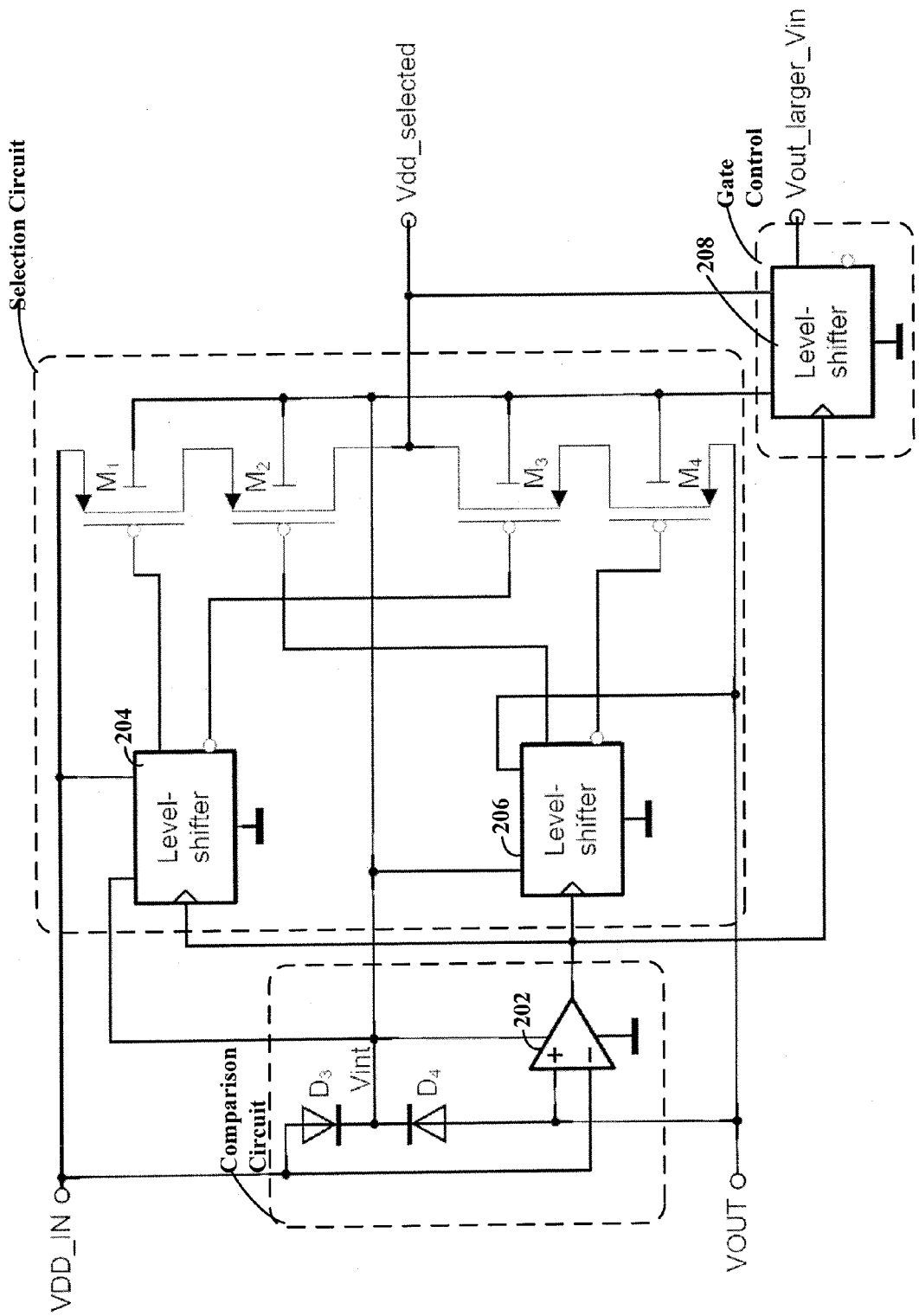
FIG. 2 depicts a circuit diagram that includes a gate controller, selection circuit and a comparison circuit, consistent with embodiments of the present disclosure.

FIG. 2 depicts a circuit diagram that includes a gate controller, selection circuit and a comparison circuit, consistent with embodiments of the present disclosure. The comparison circuit includes a supplemental supply node Vint, which is generated using two diodes (e.g., bipolar diodes or bipolar or MOS transistors in diode configuration). This internal node is set by the greater of VDD_IN and VOUT (minus a diode drop/forward voltage). This internal node supplies a comparator 202 that produces an output that is responsive to a comparison of the voltages on VDD_IN and VOUT. The depicted embodiment of the comparison circuit provides as outputs both the supplemental supply node Vint and the output of comparator 202.

According to one embodiment of the present disclosure, comparator 202 is powered from the Vint supply node. Thus, the comparator 202 is powered by and provides an output that corresponds to the highest input voltage of the selection circuit.

Consistent with certain embodiments of the present disclosure, the comparator circuit can include (but does not require in all embodiments), an offset. This offset allows the output of the comparator to be adjusted/set to a desired comparison point, i.e., rather than be a straight comparison between the voltages on VDD_IN and VOUT. The offset can be achieved using a number of different variations. A few non-limiting variations are provided for illustration purposes. In one embodiment, the internal components of the comparator 202, such as the transistor elements, can be designed to be asymmetrical. Thus, the response of the comparator 202 is not a direct one-for-one of the voltages of VDD_IN and VOUT. The asymmetry can be accomplished a number of ways including, but not limited to, modifications of gate width and/or length, the use of different current sources and/or the use of resistive elements. In another embodiment, the inputs to the comparator 202 can be modified by deriving the input voltage from the respective voltages of VDD_IN and VOUT. For instance, the voltage at the input of comparator 202 can be lower than the voltage VOUT (or VDD_IN) when a diode is placed between VOUT and the input. This diode is oriented so that it becomes forward biased when a voltage is present on VOUT. The corresponding voltage seen on the input of comparator 202 is thereby lower than the voltage at VOUT by the forward voltage/diode drop. Another embodiment uses one or more resistors to adjust the voltage on the input(s) of comparator 202.

Consistent with embodiments of the present disclosure, a selection circuit provides an output that represents the voltage selected being one of the voltages of VDD_IN and VOUT. This selected voltage (Vdd_selected) can then be used as a supply voltage for other components of the output stage device. Transistors M1-M4 connect either VDD_IN (enabling M1 and M2) or VOUT (enabling M3 and M4) to the output Vdd_selected. Aspects of the present disclosure recognize that transistors M1-M4 may also be subject to potential backdrive currents. Accordingly, the selection circuit can be configured to reduce or eliminate the backdrive currents through these transistors.

According to an embodiment of the present disclosure, the N-well/body of transistors M1-M4 are each connected to Vint. Thus, the N-wells are set near the highest input voltage of the selection circuit. Moreover, the series connection of M1 and M2 are driven by two different versions of the output of comparator 202. Level shifter 204 generates the first version by level shifting according to the voltage of VDD_IN. Level shifter 206 generates the second version by level shifting according to VOUT. This can be particularly useful for ensuring that only one set of transistors (M1-M2 or M3-M4) is turned on at any given time, regardless of which of the nodes VOUT and VDD_IN features the higher voltage.

According to embodiments of the present disclosure, the gate control receives as inputs the output of comparator 202, Vint and the Vdd_selected. Level shifter 208 generates a level shifted version of the output of comparator 202, the level being set according to the Vdd_selected.

Figure 3:
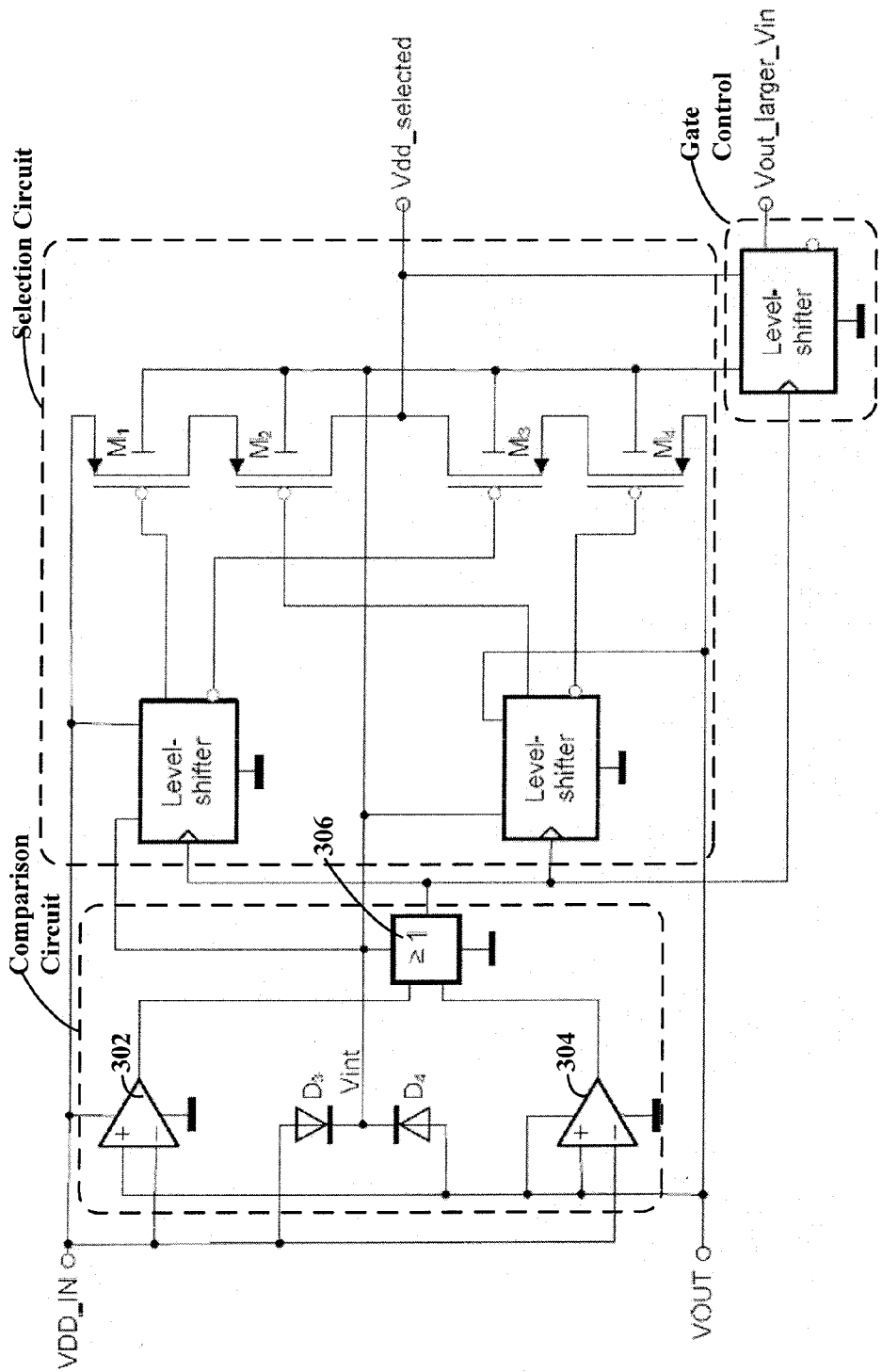
FIG. 3 depicts another circuit diagram that includes a gate controller, selection circuit and a comparison circuit, consistent with embodiments of the present disclosure.

FIG. 3 depicts another circuit diagram that includes a gate controller, selection circuit and a comparison circuit, consistent with embodiments of the present disclosure. The comparison circuit includes two comparators 302 and 304. The outputs of these two comparators are combined using logic circuitry 306.

As comparators 302 and 304 are powered directly by voltages from VDD_IN and VOUT, respectively, they are not subject to the voltage drop created by diodes D3 and D4 or to voltage variations related thereto. This can be particularly useful for allowing the comparators to operate reliably and be stable at lower voltages. The comparators are each designed to compare VDD_IN and VOUT. Thus, when both VDD_IN and VOUT are present, the comparators provide a similar output (albeit potentially at different voltage levels). If only one of VDD_IN and VOUT are present, then the corresponding comparator provides an output signal, while the other comparator may not provide an output signal.

Logic circuitry 306 is designed to provide the combination (logical OR) of the outputs of the two comparators 302 and 304. This can be particularly useful for generating an output signal when only one of VDD_IN and VOUT has a voltage present. The output of the logic circuitry 306 is provided to the level shifters of the selection circuit and gate control, which translate the signal from the logic circuitry to a voltage level of either VOUT or VDD_IN.

It has been recognized that the node Vint is not ideal for all uses. For instance, the voltage on Vint is reduced as the amount of current through Diodes D3 and D4 is increased. The OR-gate draws little current unless it is active and generally draws less current than the supply of a comparator. Moreover, circuit elements connected to Vint (e.g., level shifters) can have variable current draws, which can cause the current on Vint to vary. Varying current can cause undesirable dips in voltage, which can adversely affect the stability of a comparator that is powered by the voltage. For instance, level shifters can include inverters, buffers and similar circuits that draw current from the Vint node during a signal transition.

The depicted logic circuitry 306 uses Vint as supply voltage, in order to ensure its operation, irrespective of which of the nodes VDD_IN or VOUT are at the higher voltage. A transition of the logic state of one of the two comparators 302 and 304, causing a transition of the logic circuitry 306, might result in a voltage dip of node Vint. Such a dip, however, does not affect the operation and logic states of the comparators 302 and 304, ensuring the desired logic state will finally be reached at the output of the logic circuitry 306.

Current draw on the output node Vout can be a concern in certain situations. While comparator 304 draws a relatively small current (e.g., in the lower μA-range) from the output node, this current is significantly less than backdrive current that could occur from a current floating into the supply node.

Figure 4:
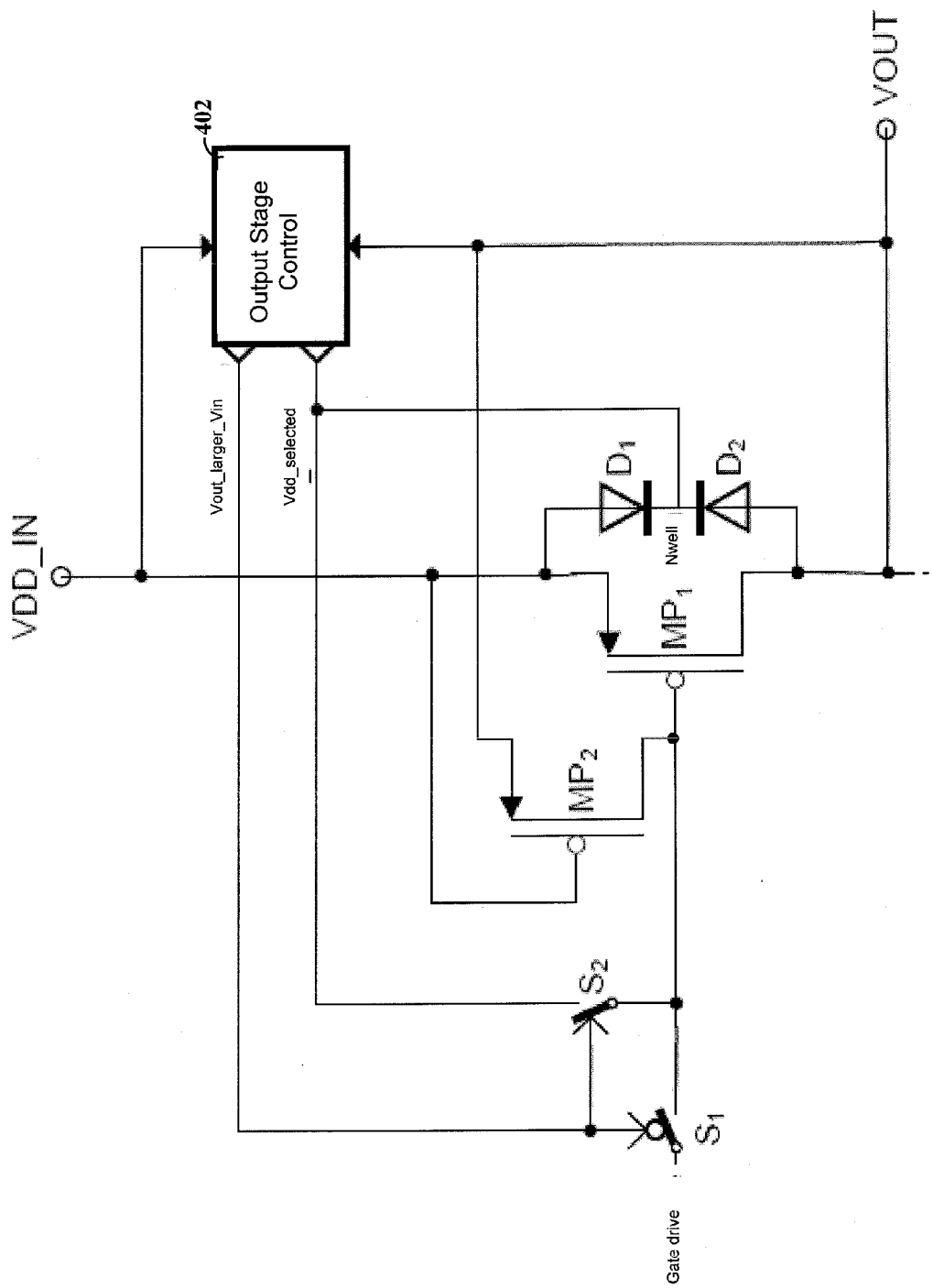
FIG. 4 depicts a block diagram of an output stage device with a protection transistor, consistent with embodiments of the present disclosure.

FIG. 4 depicts a block diagram of an output stage device with a protection transistor, consistent with embodiments of the present disclosure. The output stage control block 402 can be implemented consistent with various embodiments shown in FIGS. 1-3 and/or discussed herein. Thus, output stage control block 402 can provide a gate control (e.g., Vout_larger_Vin) and a selected voltage (e.g., vdd_selected). Even at very low voltage levels of VOUT and VDD_IN, the transistor MP1 can begin conducting current once Vout exceeds VDD_IN by a threshold voltage level. Accordingly, the addition of transistor MP2 pulls the gate of MP1 towards VOUT if VOUT exceeds VDD_IN by about this threshold voltage. Thus, the conduction for low voltage levels of VOUT can be reduced or eliminated.

Figure 5:
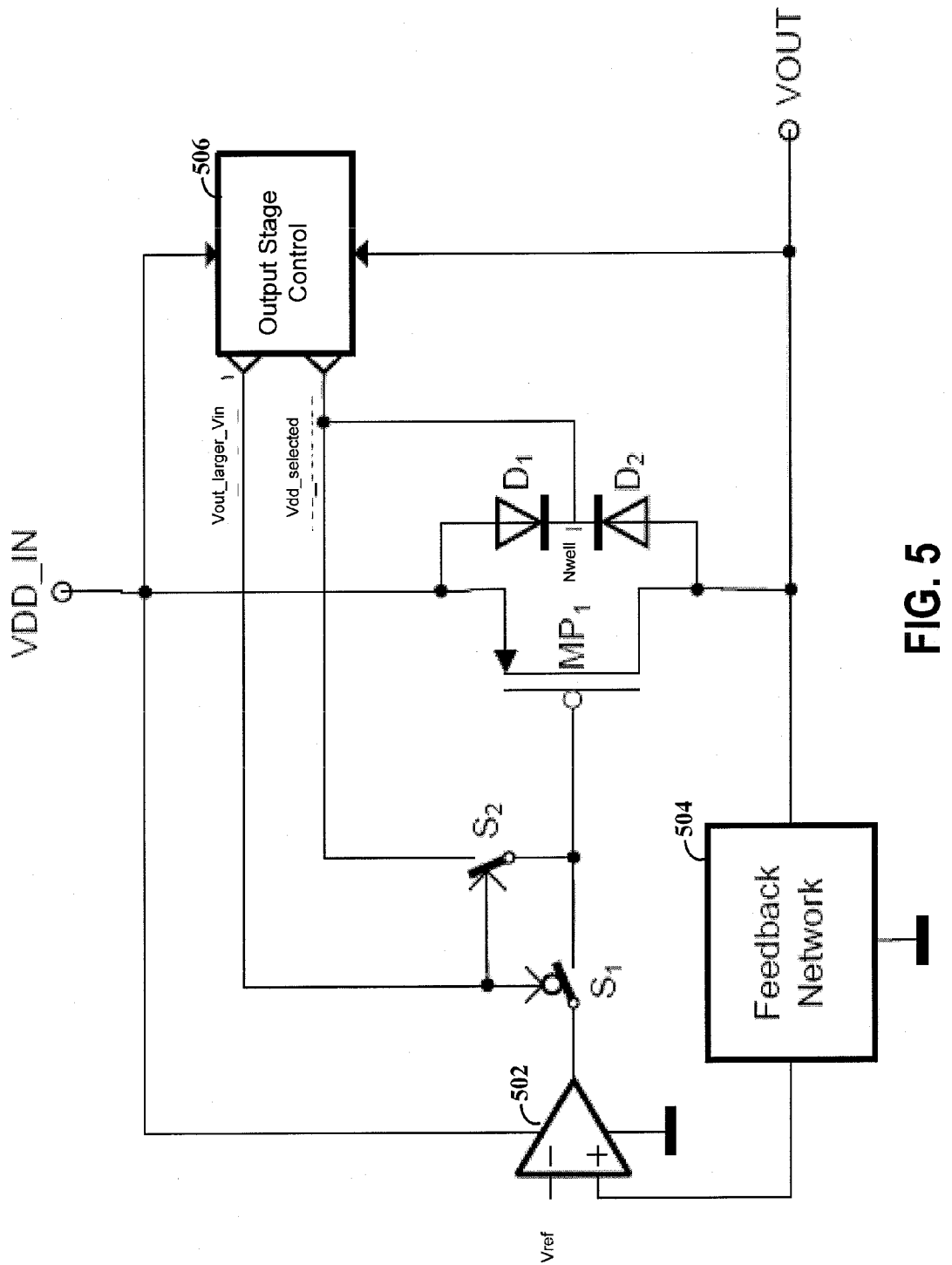
FIG. 5 depicts a block diagram for use as voltage regulator (e.g., a low-drop-out (LDO) regulator), consistent with embodiments of the present disclosure.

FIG. 5 depicts a block diagram for use as voltage regulator (e.g., low-drop-out (LDO) regulator), consistent with embodiments of the present disclosure. The block diagram is related to the recognition that aspects of the present disclosure do not include a voltage drop, increased silicon area and/or reduced drive-current that are associated with a series blocking element. Accordingly, the use of the teachings of the present disclosure can be particularly useful for systems designed to provide LDO regulation, although various other circuits and voltage regulators can be used as well. Thus, while FIG. 5 depicts an embodiment of the present disclosure as applied to a PMOS-LDO, there are any number of different uses for the embodiments discussed herein including, but not limited to, various types of input-output buffers and voltage regulators.

Operational amplifier 502 produces a signal that is based upon a comparison of a reference voltage to a voltage received from feedback network 504. This generated signal is connected through switch S1 to transistor MP1. During normal operation (e.g., not a backdrive situation) transistor MP1 controls the voltage on VOUT in response to this signal. Feedback network 504 provides a negative feedback and is designed to produce the desired output voltage of the LDO. Output stage control 506 detects potential backdrive conditions and adjusts switches S1 and S2 accordingly. The output stage control 506 also provides a Vdd_selected voltage that is derived from either the voltage on VOUT or the voltage on VDD_IN.

Although not depicted expressly in the figures, embodiments of the present disclosure contemplate combinations of the various elements therein. For instance, FIG. 5 can be modified to include the second transistor MP2 in a manner consistent with that depicted in FIG. 4. Other variations, combinations and modifications are also possible. One such variations uses current-driven logic, which can reduce or eliminate the need for the generation of a supplemental voltage and/or for the levelshifting of various signals.

Based upon the above discussion and illustrations, those skilled in the art will readily recognize that various modifications and changes may be made without strictly following the exemplary embodiments and applications illustrated and described herein. For example, the voltage levels and specific circuits are provided by way of example and are not necessarily limiting. Such modifications do not depart from the true spirit and scope of the present disclosure, including that set forth in the following claims.

What is claimed is:

1. A transistor output stage device is subject to back voltage from an output node of the device, the device comprising:
   a transistor having a gate, a source, a drain and a body;
   an electrical connection between a supply voltage node and the source;
   an electrical connection between the output node of the device and the drain;
   a comparison circuit configured and arranged to generate a selection signal in response to a comparison of a voltage on the supply voltage node and a voltage on the output node;
   a voltage selection circuit configured and arranged to, in response to the selection signal, provide a selected voltage that is the higher of the voltage on the supply voltage node and the voltage on the output node;
   an electrical connection between the body and a node providing the selected voltage; and
   a gate controller configured and arranged to,
      connect, in response to the selection signal indicating that the voltage on the supply voltage node is higher than the voltage on the output node, the gate to an input of the device, and
      connect, in response to the selection signal indicating that the supply voltage is lower than the voltage on the output node, the gate to the node providing the selected voltage.

2. The device of claim 1, wherein the comparison circuit includes
   a comparator configured and arranged to compare the voltage on the supply voltage node and the voltage on the output node, and in response thereto, generate a comparator output signal.

3. The device of claim 2, further including
   two diode functioning circuit elements;
   an electrical connection between the supply voltage node and an anode of a first one of the diode functioning circuit elements;
   an electrical connection between the output voltage and an anode of a second one of the diode functioning circuit elements; and
   an electrical connection between cathodes of the two diode functioning circuit elements;
   wherein the comparison circuit is configured and arranged to provide the comparator output signal at a signal level corresponding to a voltage of the electrical connection between cathodes of the two diode functioning circuit elements.

4. The device of claim 2, wherein
   the comparator is configured to provide the comparator output signal at a voltage level corresponding to a voltage of the output node; and
   the comparison circuit further includes
      another comparator configured and arranged to compare the voltage on the supply voltage node and the voltage on the output node, and in response thereto, generate another comparator output signal having a voltage level corresponding to a voltage of the supply voltage node; and
      a logical circuit for combining the comparator output signal with the other comparator output signal.

5. The device of claim 4, wherein at least one of the comparators is configured with an offset.

6. The device of claim 1, wherein the voltage selection circuit includes
   a first level shifter circuit that is configured and arranged to level shift the selection signal to a voltage level of the voltage on the supply voltage node, and
   a second level shifter circuit that is configured and arranged to level shift the selection signal to a voltage level of the voltage on the output node.

7. The device of claim 6, wherein the voltage selection circuit includes
   a first switch circuit having first and second switch transistors arranged in series,
      the first switch transistor configured and arranged to provide the voltage on the supply voltage node in response to the first level shifter circuit; and
      the second switch transistor configured and arranged to provide the voltage on the supply voltage node in response to the second level shifter circuit; and
   a second switch circuit having third and fourth switch transistors arranged in series,
      the third switch transistor configured and arranged to provide the voltage on the output node in response to the first level shifter circuit; and
      the fourth switch transistor configured and arranged to provide voltage on the output node in response to the second level shifter circuit.

8. The device of claim 1, wherein the gate controller includes a level shifter circuit that is configured and arranged to level shift the selection signal to a voltage level of the selected voltage for either of the possible selected voltages.

9. The device of claim 1, wherein the transistor is a PMOS transistor.

10. The device of claim 1, further including circuitry for providing at least one of a low drop out regulation of the voltage on the output node, an input-output of an integrated circuit and a buffer circuit.

11. The device of claim 1, further including a feedback network for connecting the output node to the input node to provide low drop out regulation of the voltage on the output node.

12. The device of claim 1, further including another transistor configured and arranged to pull the gate of the transistor to the voltage on the output node when the voltage on the supply voltage node is less than the voltage on the output node.

13. A method of using a transistor output stage device including a transistor having a gate, a source, a drain and a body, the device being subject to back voltage from an output node of the device, the method comprising:
   comparing a voltage on the supply voltage node to a voltage on the output node;
   providing a selected voltage that is the higher of the voltage on the supply voltage node and the voltage on the output node;
   generating, in response to comparing, a first comparison output signal;
   generating a second comparison output signal by level shifting the first comparison output signal to a voltage level corresponding to the selected voltage;
   providing the selected voltage to the body of the transistor;
   enabling a first switch to connect, in response to the second comparison output signal, the selected voltage to the gate of the transistor; and
   enabling a second switch to connect, in response to the second comparison output signal, an input node to the gate of the transistor.

14. The method of claim 13, further including the step of generating a supplemental voltage from the higher of a supply voltage node and an output node using two diode functioning elements connected at their cathodes to a node where the supplemental voltage is generated.

15. The method of claim 13, wherein the step of generating the first comparison output signal further includes
   comparing the voltage on the supply voltage node to the voltage on the output node using a first comparator powered by the voltage on the supply voltage node;
   comparing the voltage on the supply voltage node to the voltage on the output node using a second comparator powered by the voltage on the output node; and
   combining an output of the first comparator with an output of the second comparator to generate the first comparison output signal.

16. The method of claim 13, further including the step of using the transistor output stage device to provide, at least one of a regulation of the voltage on the output node, an output of an integrated circuit and a buffer circuit.

17. The method of claim 13, further including the step of introducing an offset to a comparator that is used in the step of comparing a voltage on the supply voltage node to a voltage on the output node.

18. The method of claim 13, further including the step of using another transistor to pull the gate of the transistor to the voltage on the output node when the voltage on the supply voltage node is less than the voltage on the output node.

19. A device comprising:
   a transistor output stage device including a transistor having a gate, a source, a drain and a body, the device being subject to back voltage from an output node of the device,
   circuitry configured to:
      compare a voltage on the supply voltage node to a voltage on the output node;
      provide a selected voltage that is the higher of the voltage on the supply voltage node and the voltage on the output node;
      generate, in response to comparing, a first comparison output signal;
      generate a second comparison output signal by level shifting the first comparison output signal to a voltage level corresponding to the selected voltage;
      provide the selected voltage to the body of the transistor;
      enable a first switch to connect, in response to the second comparison output signal, the selected voltage to the gate of the transistor; and
      enable a second switch to connect, in response to the second comparison output signal, an input node to the gate of the transistor.

20. The device of claim 19, wherein the circuitry is further configured to
   generate a supplemental voltage from the higher of a supply voltage node and an output node; and
   generate the first comparison output signal at a voltage level corresponding to the supplemental voltage.

* * * * *